US010060572B1

(12) United States Patent
Don

(10) Patent No.: US 10,060,572 B1
(45) Date of Patent: Aug. 28, 2018

(54) PORTABLE DEVICE SUPPORT SYSTEM AND METHOD

(71) Applicant: Joan Don, Lindsay (CA)

(72) Inventor: Joan Don, Lindsay (CA)

( * ) Notice: Subject to any disclaimer, the term of this patent is extended or adjusted under 35 U.S.C. 154(b) by 0 days.

(21) Appl. No.: 15/647,227

(22) Filed: Jul. 11, 2017

(51) Int. Cl.

| *F16M 11/04* | (2006.01) |
|---|---|
| *F16M 11/16* | (2006.01) |
| *F16B 2/12* | (2006.01) |
| *F16M 11/24* | (2006.01) |
| *H05K 5/02* | (2006.01) |
| *H05K 7/14* | (2006.01) |

(52) U.S. Cl.
CPC ............ *F16M 11/041* (2013.01); *F16B 2/12* (2013.01); *F16M 11/16* (2013.01); *F16M 11/24* (2013.01); *H05K 5/0217* (2013.01); *H05K 7/14* (2013.01)

(58) Field of Classification Search
CPC ...... F16M 11/041; F16M 11/16; F16M 11/24; F16B 2/12; F16B 2/14; H05K 5/0234; H05K 5/023; H05K 5/0217; H05K 7/1404
See application file for complete search history.

(56) References Cited

U.S. PATENT DOCUMENTS

| 7,758,001 B2 * | 7/2010 | Bouissiere | F16M 11/041 248/206.5 |
|---|---|---|---|
| 8,066,241 B2 * | 11/2011 | Yu | F16M 11/041 248/286.1 |
| 8,622,359 B2 | 1/2014 | Carnevali | |
| 9,038,971 B1 * | 5/2015 | Guthrie | F16M 13/022 248/121 |
| 9,818,001 B2 * | 11/2017 | Galant | G06F 21/88 |
| 9,890,899 B2 * | 2/2018 | Theis | F16M 13/022 |
| 9,891,504 B2 * | 2/2018 | Fromm | G03B 17/561 |
| 9,919,659 B2 * | 3/2018 | Kipp | B60R 11/02 |
| 2012/0234055 A1 * | 9/2012 | Bland, III | E05B 73/0082 70/15 |
| 2012/0241567 A1 * | 9/2012 | Gillespie-Brown | B60R 11/00 248/122.1 |
| 2012/0273630 A1 * | 11/2012 | Gillespie-Brown | F16M 11/041 248/122.1 |
| 2012/0312936 A1 * | 12/2012 | Huang | F16M 11/041 248/122.1 |
| 2013/0206942 A1 * | 8/2013 | Trotsky | F16M 11/041 248/274.1 |
| 2014/0168890 A1 * | 6/2014 | Barnard | G06F 1/1626 361/679.55 |
| 2014/0183314 A1 * | 7/2014 | Mulhern | F16M 13/022 248/288.11 |

(Continued)

*Primary Examiner* — Binh Tran
*Assistant Examiner* — Douglas Burtner
(74) *Attorney, Agent, or Firm* — Integrity Patent Group, PLC; Edwin Wold

(57) ABSTRACT

A portable device support system including a disc-shaped central hub having a mounting slot, two pairs of crossing support arms having a corner support tab for releasably securing a mobile device, and a supporting attachment with mounting insert configured to connect with the central hub. The crossing support arms are configured to expand outwardly in order to securely grasp edges of a mobile device and hold it in a desired position. The supporting attachment may feature a securing mechanism at its base, further making the system useful for holding a mobile device securely in position across a variety of locations and working environments.

19 Claims, 6 Drawing Sheets

(56) References Cited

U.S. PATENT DOCUMENTS

| | | | |
|---|---|---|---|
| 2015/0060624 A1* | 3/2015 | Huang | H05K 5/0204 248/316.4 |
| 2015/0260333 A1* | 9/2015 | Polyakov | F16M 11/041 248/176.3 |
| 2017/0009935 A1* | 1/2017 | Theis | F16M 11/041 |
| 2017/0016463 A1* | 1/2017 | Koonce | F16B 2/12 |

* cited by examiner

PORTABLE DEVICE SUPPORT SYSTEM AND METHOD

BACKGROUND OF THE INVENTION

The following includes information that may be useful in understanding the present disclosure. It is not an admission that any of the information provided herein is prior art nor material to the presently described or claimed inventions, nor that any publication or document that is specifically or implicitly referenced is prior art.

1. Field of the Invention

The present invention relates generally to the field of supports and more specifically relates to adjustable multimedia supports.

2. Description of Related Art

In the field of supports, a multimedia support is often an upright, self-standing, or anchorable device with an adjustable receptacle to hold and support a mobile device or other object in a tiltable position above a seated or reclining person. The support may further be adjusted to maintain a comfortable distance above a general horizontal surface underneath or beside that person as they rest in a chair, couch, bed, or on the floor.

Multimedia supports are often little more than horizontal platforms above the floor. Theses devices generally straddle the person, are not retractable to a compact state, are unstable when used with larger devices or heavy objects, do not allow for systematic customization, are not self-supporting, are unsuitable for a seated person, or do not provide the level of adjustability often desired for viewing and manipulating the object that is supported. A suitable solution is desired.

U.S. Pat. No. 8,622,359 to Carnevali relates to a mounting for a portable device. The described mounting for a portable device includes a body with a base covered by a cover having an exterior interface surface, the base and cover substantially enclosing an interior space therebetween with two pivots in spaced apart positions between the base and cover. A pair of substantially rigid arms crossing in a substantially X-shaped pattern and spreadable about the interface surface of the cover are set within the body. Each of the arms has: a rotation portion pivotally coupled to one of the pivots, a pair of substantially upright clamping fingers adjacent to opposite distal end portions thereof and positioned externally of the interior space of the body and projected upwardly above the exterior interface surface of the cover portion thereof, and a handle projected therefrom. A biasing member is coupled between attachment points of the arms for biasing together opposing pairs of the clamping fingers.

BRIEF SUMMARY OF THE INVENTION

In view of the foregoing disadvantages inherent in the known supports art, the present disclosure provides a novel portable device support system. The general purpose of the present disclosure, which will be described subsequently in greater detail, is to provide a portable device support system.

A portable device support system is disclosed herein. The portable device support system includes a disc-shaped central hub having a top surface, a bottom surface, and a raised perimeter surface including two pairs of opposing apertures and a mounting slot, along with two pairs of crossing support arms, each having a corner support tab at its distal end configured to releasably secure a mobile device. In addition, the portable device support system may include a supporting attachment having a base apparatus, a body, and a mounting insert configured to removably couple within the mounting slot, and a carrying case. The supporting attachment may be configured to provide a foundation for the disc-shaped central hub. In a preferred embodiment, the crossing support arms of the portable device support system may be configured to extend outwardly and retract in a pair-wise manner from the disc-shaped central hub through the opposing apertures.

According to another embodiment, a method of use for the portable device support system is also disclosed herein. The method of use may include the steps of extending crossing support arms, placing a mobile device in position, securing the mobile device within a receiving pocket of each corner support tab, tightening and locking the crossing support arms, positioning a disc-shaped central hub onto a supporting attachment, and using the mobile device.

For purposes of summarizing the invention, certain aspects, advantages, and novel features of the invention have been described herein. It is to be understood that not necessarily all such advantages may be achieved in accordance with any one particular embodiment of the invention. Thus, the invention may be embodied or carried out in a manner that achieves or optimizes one advantage or group of advantages as taught herein without necessarily achieving other advantages as may be taught or suggested herein. The features of the invention which are believed to be novel are particularly pointed out and distinctly claimed in the concluding portion of the specification. These and other features, aspects, and advantages of the present invention will become better understood with reference to the following drawings and detailed description.

BRIEF DESCRIPTION OF THE DRAWINGS

The figures which accompany the written portion of this specification illustrate embodiments and methods of use for the present disclosure, a portable device support system, constructed and operative according to the teachings of the present disclosure.

The various embodiments of the present invention will hereinafter be described in conjunction with the appended drawings, wherein like designations denote like elements.

DETAILED DESCRIPTION

Figure 1:
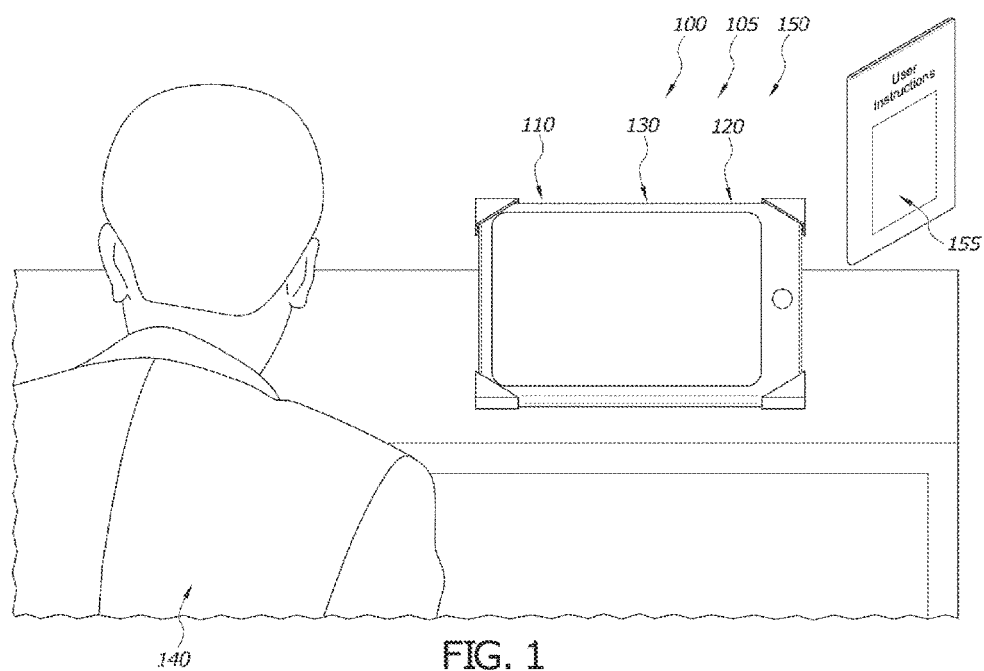
FIG. 1 is a perspective view of the portable device support system during an 'in-use' condition, according to an embodiment of the disclosure.

As discussed above, embodiments of the present disclosure relate to adjustable multimedia supports and more particularly to a portable device support system as used to improve the protection, stability, and customization of a mobile device support system.

Generally, the basic unit or carrying device may comprise adjustable arms with rubber corner tabs at their ends, a central hub thru which the arms pass, and a slot at the base of the central hub. As disclosed, this system is universal in that it can fit virtually any device including phones, tablet computers, e-readers, and even older generation media such as books, notepads, sheet music, recipes, and many other items. The system is portable in that it can be carried and used in almost any location and setting in order to provide stability and protection for included devices while still allowing the units retained within to remain plugged in to a charger or other accessories. The system is further configured to be adaptable and expandable in a modular fashion as it provides a structure by which future accessories, supports, and other customizable implements may be added and configured to couple with the central hub. This allows for virtually unlimited possibilities in its use and application.

The portable device support system of this disclosure provides a base unit that may hold the device snugly and can be modified to build additional layers of protection around it. The central unit can be placed on its stand, in its carrier, on a wall, or even a post. It may allow a user to have access to a mobile device of their choosing at almost any location while charging. This is of great benefit for a user who would like to rest their mobile device for use next to them while driving in the car, traveling, in a kitchen, or for reading in bed. These are just a few of the application for this portable device support system.

The portable device support system is adaptable and flexible in its design, allowing the system to be used for numerous sizes of electronic devices in multiple settings while still providing protection. The system works by having a flexible and sturdy attachment in each of the four corners that allow for a secure and flexible grabbing to occur. The attachments are located at the end of each adjustable arm which pass through the main hub. In one embodiment, the central hub may include a disc or rotatable wheel assembly on the back of the device to selectably control the extension, retraction, and locking of the device. This rotatable wheel assembly may make it easy for a user to place a mobile device or other item within the mounting region and attachment arms and then simply twist the arms in place for a secure and convenient grip upon the device of choice to occur.

In another embodiment, the portable device support system may include a means for increasing the stability of the device in the form of stability posts that may project from the backside of each attachment arm in such a configuration that allows for a removable security strap to be stretched in place around the four stability posts. This security strap may provide additional reinforcement by structurally adjoining each of the attachment arms together. Further embodiments may include an attachment slot nearest the bottom of the central hub that may be useful for connecting the main central hub responsible for holding onto a mobile device to additional accessories that may include desk mounts, adjustable stands, charging stations, portable cases, furniture, vehicle mounts, travel accessories, office supports, adjustable clips, tri-pods, speaker mounts, entertainment systems, and many other customizable and future applications.

Referring now more specifically to the drawings by numerals of reference, there is shown in FIGS. 1-4 and FIG. 6, various views of a portable device support system 100. FIG. 1 shows a portable device support system 100 during an 'in-use' condition 150, according to an embodiment of the present disclosure. Here, the portable device support system 100 may be beneficial for use by a user 140 to increase protection, stability, and customization of a mobile device. As illustrated, the portable device support system 100 may include a disc-shaped central hub 110, two pairs of crossing support arms 120, and a supporting attachment 130.

According to one embodiment, the portable device support system 100 may be arranged as a kit 105 (FIG. 1). In particular, the portable device support system 100 may further include a set of instructions 155 (FIG. 1). The instructions 155 may detail functional relationships in relation to the structure of the portable device support system 100 (such that the portable device support system 100 can be used, maintained, or the like, in a preferred manner).

Figure 2:
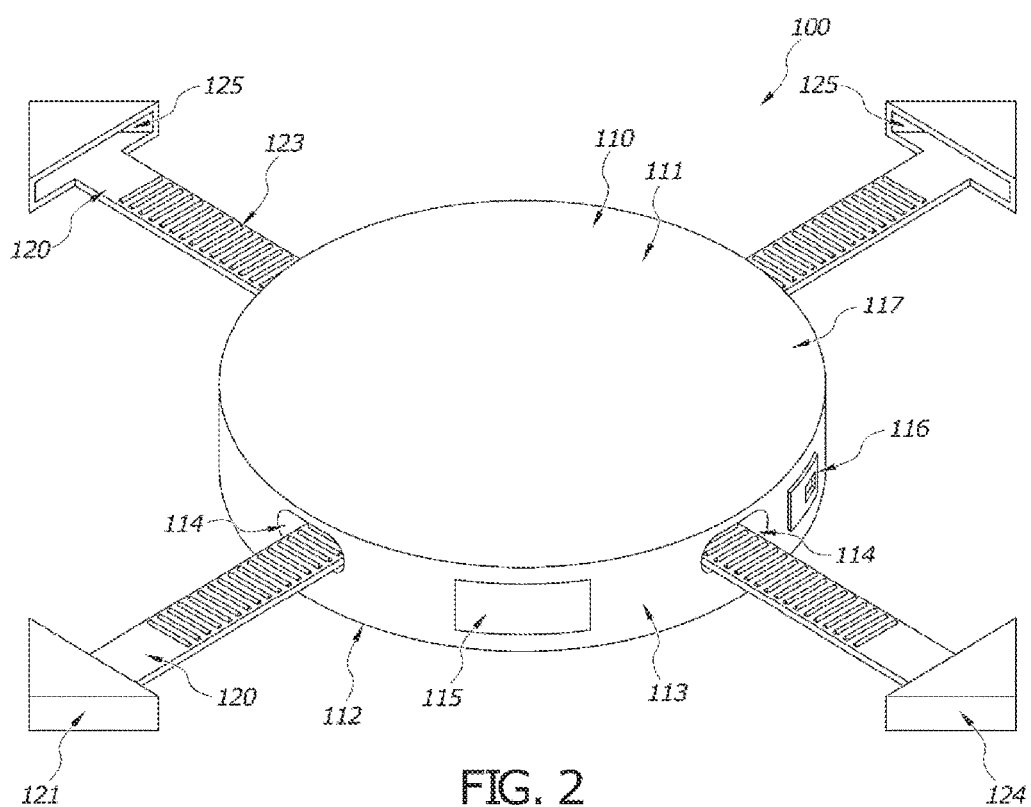
FIG. 2 is a top angled view of the portable device support system of FIG. 1 illustrating the disc-shaped central hub including crossing support arms and corner support tabs open for receiving a mobile device, according to an embodiment of the present disclosure.

FIG. 2 shows the portable device support system 100 of FIG. 1, according to an embodiment of the present disclosure. As above, the portable device support system 100 may include a disc-shaped central hub 110 having a top surface 111, a bottom surface 112, and a raised perimeter surface 113 including two pairs of opposing apertures 114 and a mounting slot 115. The portable device support system 100 of FIG. 1 may further include two pairs of crossing support arms 120, with each of the crossing support arms 120 having a corner support tab 121 located at its distal end. The disc-shaped central hub 110 may feature a locking mechanism 116 for holding the crossing support arms 120 in a fixed position and a protective barrier 117 to substantially prohibit scratching to the disc-shaped central hub 110 or related attachments used therewith. In addition, the included crossing support arms 120 may themselves feature incremental notches 123 useful for selectable adjustment. The corner support tab 121 located at the distal end of each of the crossing support arms 120 may be constructed from a substantially durable and pliable rubber material 124 and include a pocketed trough 125 for frictionally securing items therein.

Figure 3:
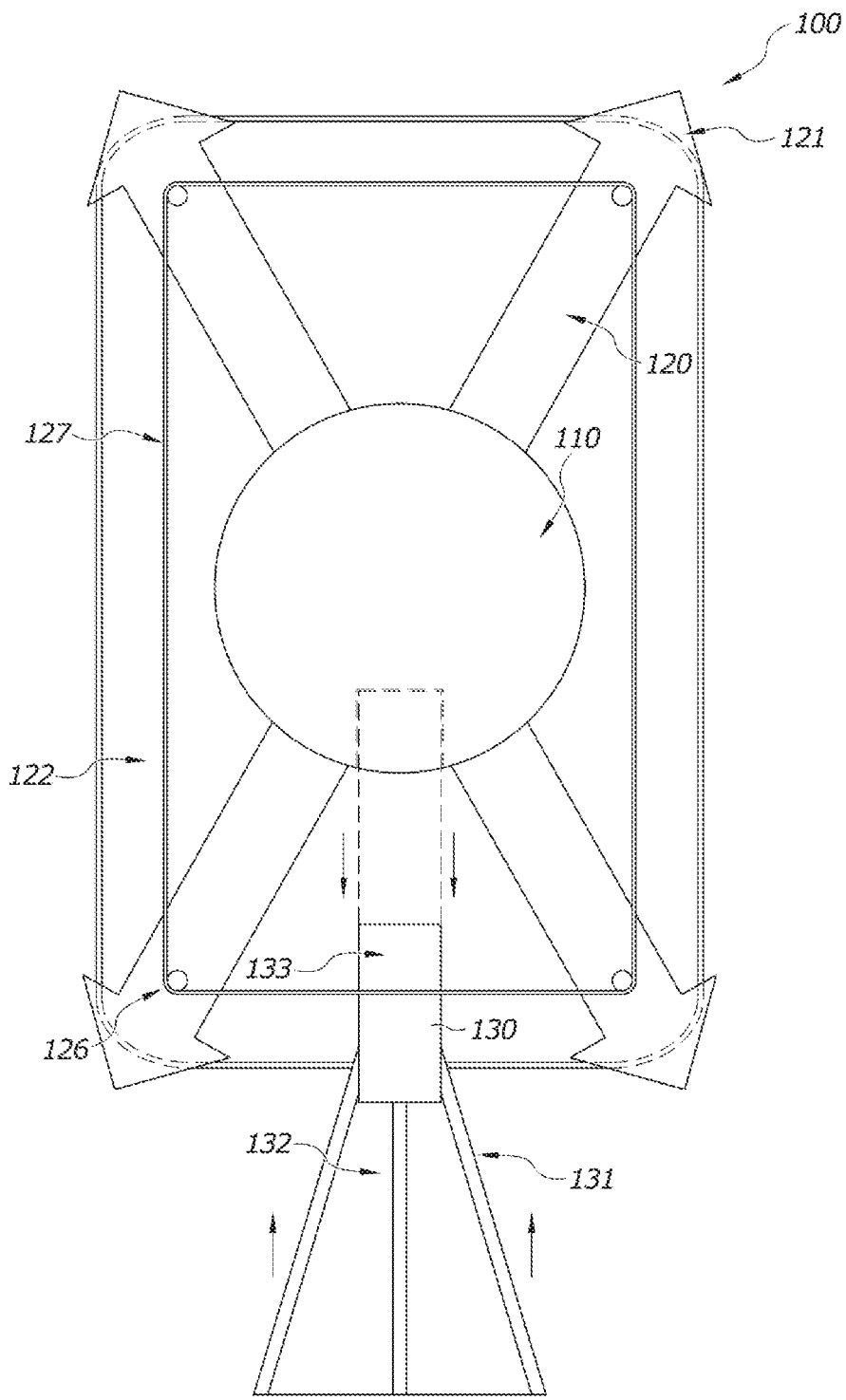
FIG. 3 is a rear view of the portable device support system of FIG. 1 showing the disc-shaped central hub with a mobile device secured within being lowered onto a supporting attachment, according to an embodiment of the present disclosure.

FIG. 3 is a rear view of the portable device support system 100 of FIG. 1, according to an embodiment of the present disclosure. The portable device support system 100 again may include a disc-shaped central hub 110, two pairs of crossing support arms 120, and a supporting attachment 130 having a base apparatus 131, a body 132, and a mounting insert 133 useful for connecting the supporting attachment 130 to the disc-shaped central hub 110. In addition, this view illustrates the corner support tab 121 of the crossing support arms 120 frictionally securing an outer edge of a mobile device 122 therein. The corner support tab 121 of the crossing support arms 120 may further include a backing post 126 configured to receive a supplementary bracing strap 127 for additional stabilization to the portable device support system 100 and mobile device 122 supported within.

Figure 4:
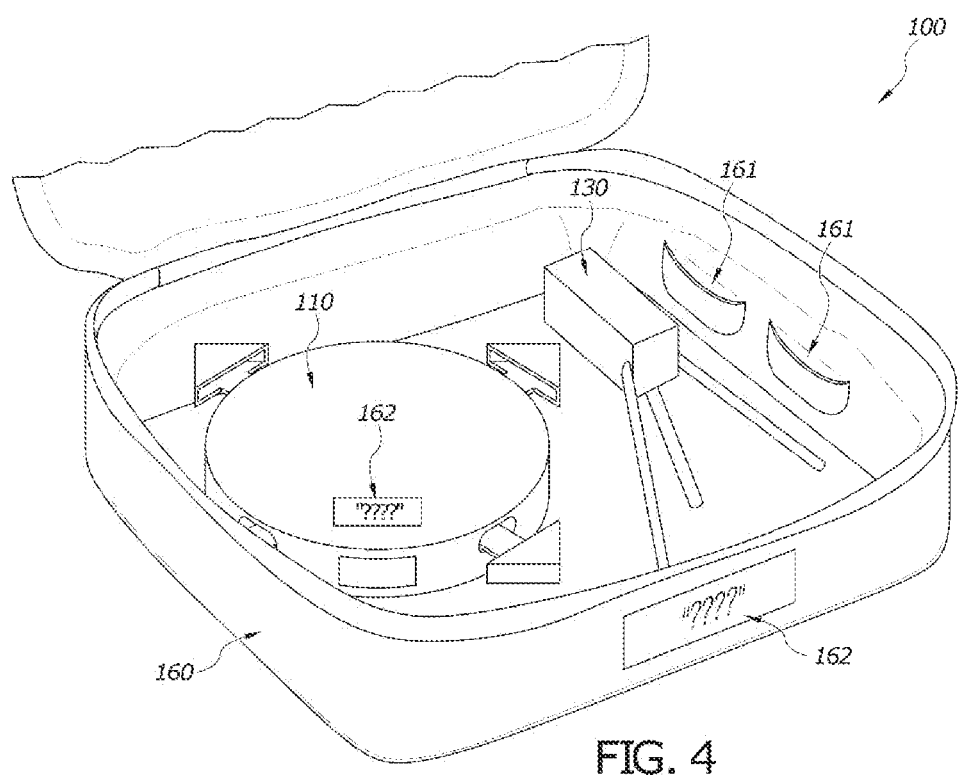
FIG. 4 is a perspective view of the portable device support system of FIG. 1 detailing the disc-shaped central hub in a retracted position along with a support stand inside of a carrying case, according to an embodiment of the present disclosure.

FIG. 4 is a perspective view of the portable device support system 100 of FIG. 1 illustrating the disc-shaped central hub 110 and supporting attachment 130 being stored in a carrying case 160, according to an embodiment of the present disclosure. The carrying case 160 displayed herein may itself include at least two storage compartments 161 for holding accessories and a customizable component 162 for the addition of decorative designs and indicia by a user which function to personalize said portable device support system 100.

Figure 5:
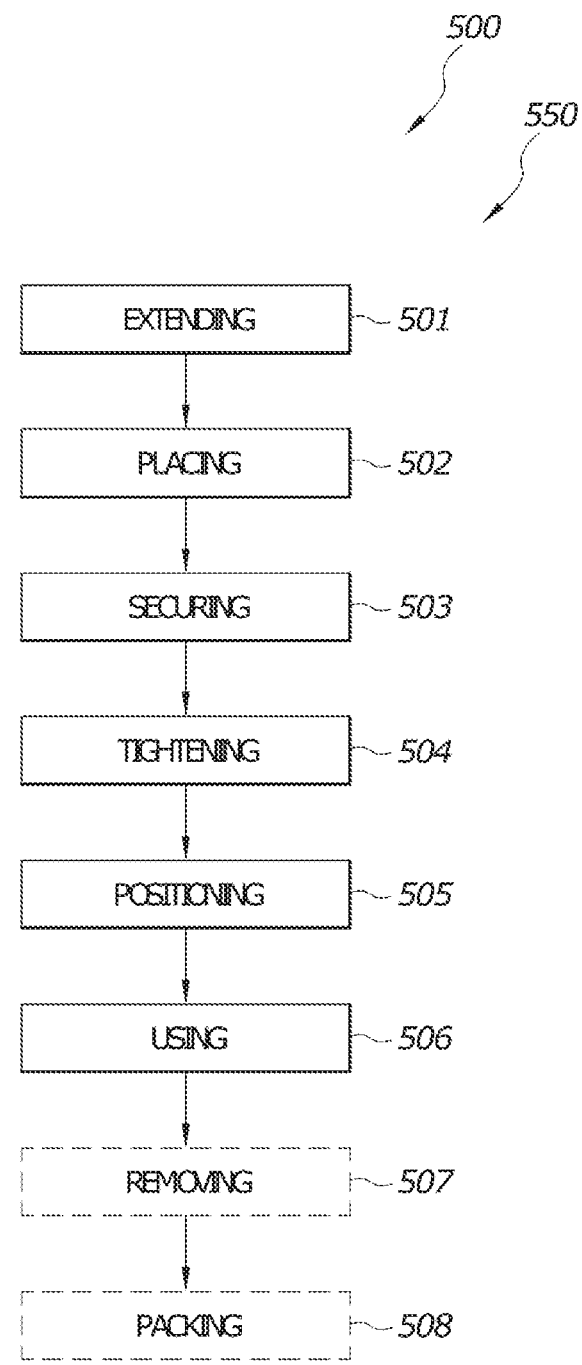
FIG. 5 is a flow diagram illustrating a method of use for the portable device support system according to an embodiment of the present disclosure.

FIG. 5 is a flow diagram illustrating a method of use 500 for the portable device support system 100, according to an embodiment of the present disclosure. In particular, the method of use 500 for the portable device support system 100 may include one or more components or features of the portable device support system 100 as described above. As illustrated, the method for method of use 500 for the portable device support system 100 may include the steps of: step one 501, extending crossing support arms 120; step two 502, placing a mobile device 122 in position; step three 503, securing the mobile device 122 within a receiving pocket of each corner support tab 121; step four 504, tightening and locking the crossing support arms 120; step five 505, positioning a disc-shaped central hub 110 onto a supporting attachment 130; and step six 506, using the mobile device 122.

Figure 6:
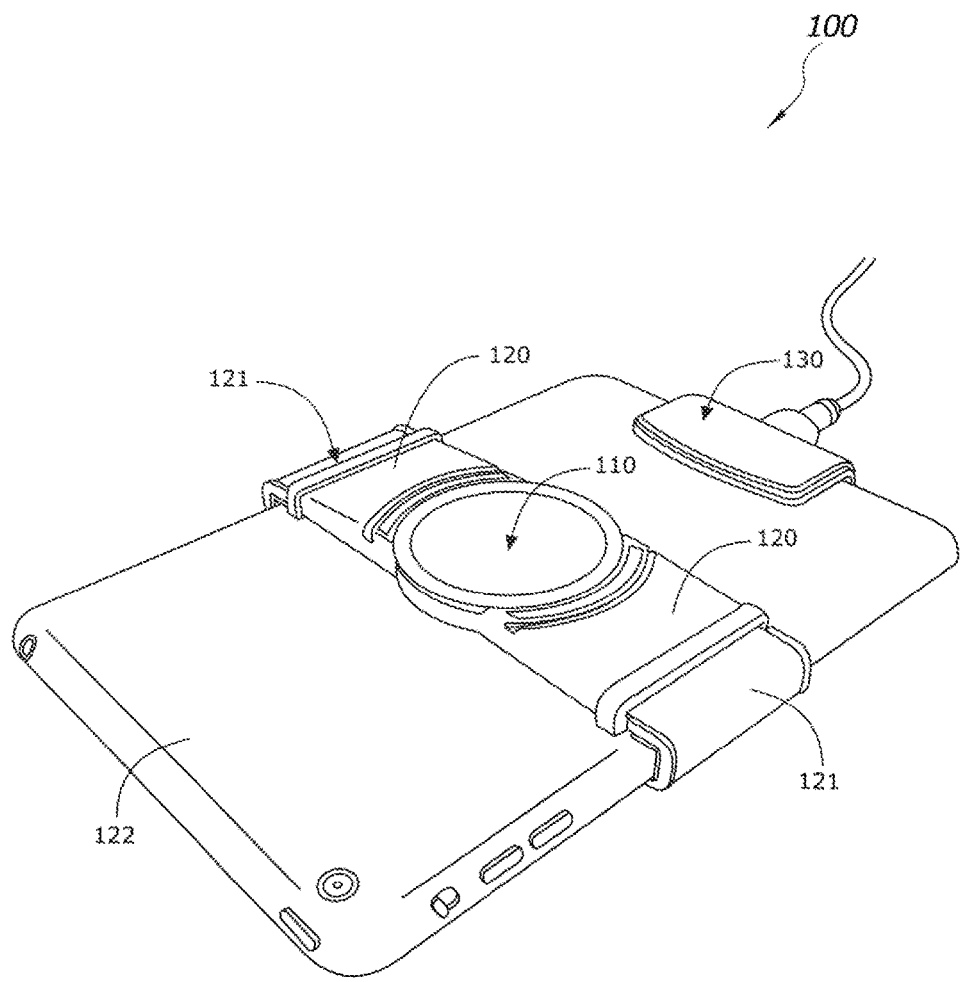
FIG. 6 is an alternate rear perspective view of the portable device support system of FIG. 1 showing the disc-shaped central hub with a mobile device coupled within, according to an embodiment of the present disclosure. In this embodiment, the portable device support system may include a single pair of crossing support arms for removably securing an item by its sides.

FIG. 6 is an alternate rear perspective view of the portable device support system 100 of FIG. 1, according to an embodiment of the present disclosure. The portable device support system 100 again may include a disc-shaped central hub 110 and a single pair of crossing support arms 120 that may be configured to secure a mobile device 122 within each opposing corner support tab 121. In this embodiment, the included supporting attachment 130 may be coupled directly to the mobile device 122.

It should be noted that step seven 507, removing the mobile device 122 from the portable device support system 100, and step eight 508, packing the supporting attachment 130 and the disc-shaped central hub 110 including the crossing support arms 120 into a carrying case 160, are optional steps and may not be implemented in all cases. Optional steps of method of use 500 are illustrated using dotted lines in FIG. 5 so as to distinguish them from the other steps of method of use 500. It should also be noted that the steps described in the method of use can be carried out in many different orders according to user preference. The use of "step of" should not be interpreted as "step for", in the claims herein and is not intended to invoke the provisions of 35 U.S.C. § 112(f). It should also be noted that, under appropriate circumstances, considering such issues as design preference, user preferences, marketing preferences, cost, structural requirements, available materials, technological advances, etc., other methods for the portable device support system 100 (e.g., different step orders within above-mentioned list, elimination or addition of certain steps, including or excluding certain maintenance steps, etc.), are taught herein.

The embodiments of the invention described herein are exemplary and numerous modifications, variations and rearrangements can be readily envisioned to achieve substantially equivalent results, all of which are intended to be embraced within the spirit and scope of the invention. Further, the purpose of the foregoing abstract is to enable the U.S. Patent and Trademark Office and the public generally, and especially the scientist, engineers and practitioners in the art who are not familiar with patent or legal terms or phraseology, to determine quickly from a cursory inspection the nature and essence of the technical disclosure of the application.

What is claimed is new and desired to be protected by Letters Patent is set forth in the appended claims:

1. A portable device support system, the system comprising:
    a disc-shaped central hub having a top surface, a bottom surface, and a raised perimeter surface including two pairs of opposing apertures and a mounting slot;
    two pairs of crossing support arms, each of said crossing support arms having a corner support tab at its distal end configured to releasably secure a mobile device;
    a supporting attachment having a base apparatus, a body, and a mounting insert configured to removably couple within said mounting slot; and
    a carrying case;
    wherein said crossing support arms are configured to extend outwardly and retract in a pair-wise manner from said disc-shaped central hub through said opposing apertures; and
    wherein said supporting attachment is configured to provide a foundation for said disc-shaped central hub,
    wherein said crossing support arms include incremental notches for selectable adjustment.

2. The portable device support system of claim 1, wherein said bottom surface controls extension and retraction of said crossing support arms by rotational manipulation.

3. The portable device support system of claim 1, wherein said crossing support arms are functionally arranged in a substantially X-shaped configuration.

4. The portable device support system of claim 1, wherein each said corner support tab is constructed from a substantially durable and pliable rubber material providing longevity in use.

5. The portable device support system of claim 4, wherein each said corner support tab features a pocketed trough for frictionally securing an outer edge of said mobile device therein.

6. The portable device support system of claim 1, wherein said base apparatus of said supporting attachment features a foundation securing mechanism selected from the group consisting of clamps, suction cups, clips, retractable legs, and a weighted housing.

7. The portable device support system of claim 1, wherein said disc-shaped central hub features a locking mechanism for holding said crossing support arms in a fixed position.

8. The portable device support system of claim 1, wherein each said corner support tab includes a backing post configured to receive a supplementary bracing strap for additional stabilization.

9. The portable device support system of claim 1, wherein said crossing support arms have an opposing wingspan measuring at least 5 inches in length.

10. The portable device support system of claim 1, wherein said supporting attachment and said disc-shaped central hub including said crossing support arms are configured to conjoin within said carrying case for purposes of storage and transport.

11. The portable device support system of claim 1, wherein said carrying case includes a protective layering and at least two storage compartments for holding accessories related to said mobile device.

12. The portable device support system of claim 1, wherein said supporting attachment, said disc-shaped central hub including said crossing support arms, and said carrying case feature a customizable component for the addition of decorative designs and indicia by the user which function to personalize said portable device support system.

13. The portable device support system of claim 1, wherein said crossing support arms do not structurally prohibit recharging of said mobile device while being secured within said portable device support system.

14. The portable device support system of claim 1, wherein said top surface of said disc-shaped central hub includes a protective barrier to substantially prohibit scratching on an underside of said mobile device.

15. The portable device support system of claim 1, wherein said crossing support arms are constructed from semi-flexible materials allowing for a slight bowing to occur when tightened to secure said mobile device.

16. A portable device support system, the system comprising:
    a disc-shaped central hub having a top surface, a bottom surface, and a raised perimeter surface including two pairs of opposing apertures and a mounting slot;
    two pairs of crossing support arms, each of said crossing support arms having a corner support tab at its distal end configured to releasably secure a mobile device;
    a supporting attachment having a base apparatus, a body, and a mounting insert configured to removably couple within said mounting slot;
    a carrying case;
    wherein said crossing support arms are configured to extend outwardly and retract in a pair-wise manner from said disc-shaped central hub through said opposing apertures;
    wherein said supporting attachment is configured to provide a foundation for said disc-shaped central hub;
    wherein said crossing support arms include incremental notches for selectable adjustment;
    wherein said bottom surface controls extension and retraction of said crossing support arms by rotational manipulation;
    wherein said crossing support arms are functionally arranged in a substantially X-shaped configuration;
    wherein each said corner support tab is constructed from a substantially durable and pliable rubber material providing longevity in use;
    wherein each said corner support tab features a pocketed trough for frictionally securing an outer edge of said mobile device therein;
    wherein said base apparatus of said supporting attachment features a foundation securing mechanism selected from the group consisting of clamps, suction cups, clips, retractable legs, and a weighted housing;
    wherein said disc-shaped central hub features a locking mechanism for holding said crossing support arms in a fixed position;
    wherein each said corner support tab includes a backing post configured to receive a supplementary bracing strap for additional stabilization;
    wherein said crossing support arms have an opposing wingspan measuring at least 5 inches in length;
    wherein said supporting attachment and said disc-shaped central hub including said crossing support arms are configured to conjoin within said carrying case for purposes of storage and transport;
    wherein said carrying case includes a protective layering and at least two storage compartments for holding accessories related to said mobile device;
    wherein said supporting attachment, said disc-shaped central hub including said crossing support arms, and said carrying case feature a customizable component for the addition of decorative designs and indicia by a user which function to personalize said portable device support system;
    wherein said crossing support arms do not structurally prohibit recharging of said mobile device while being secured within said portable device support system;
    wherein said top surface of said disc-shaped central hub includes a protective barrier to substantially prohibit scratching on an underside of said mobile device; and
    wherein said crossing support arms are constructed from semi-flexible materials allowing for a slight bowing to occur when tightened to secure said mobile device.

17. The portable device support system of claim 16, further comprising set of instructions; and
    wherein the system is arranged as a kit.

18. A method of use for the portable device support system of claim 1, the method comprising the steps of:
    extending the crossing support arms;
    placing a mobile device in position;
    securing the mobile device within a receiving pocket of each corner support tab;
    tightening and locking the crossing support arms;
    positioning the disc-shaped central hub onto the supporting attachment; and
    using the mobile device.

19. The method of claim 18, further comprising the steps of:
    removing the mobile device from the portable device support system; and
    packing the supporting attachment and the disc-shaped central hub including the crossing support arms into the carrying case.

* * * * *